United States Patent

Seki et al.

[11] Patent Number: 6,166,611
[45] Date of Patent: *Dec. 26, 2000

[54] RESONATOR LADDER TYPE SURFACE ACOUSTIC WAVE FILTER

[75] Inventors: Shun-ichi Seki, Amagasaki; Yutaka Taguchi, Takatsuki; Keiji Onishi, Settsu; Osamu Kawasaki, Kyotanabe; Kazuo Eda, Nara, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/057,916

[22] Filed: Apr. 9, 1998

[30] Foreign Application Priority Data

Apr. 10, 1997 [JP] Japan ................................... 9-091807

[51] Int. Cl.$^7$ ....................................................... H03H 9/64
[52] U.S. Cl. ........................... 333/193; 333/195; 333/194; 310/313 B
[58] Field of Search ....................................... 333/193–196

[56] References Cited

U.S. PATENT DOCUMENTS

| | | | |
|---|---|---|---|
| 5,471,178 | 11/1995 | Hickernell | 333/193 |
| 5,506,552 | 4/1996 | Seki et al. | 333/194 X |
| 5,543,757 | 8/1996 | Kobayashi et al. | 333/193 X |
| 5,559,481 | 9/1996 | Satoh et al. | 333/194 X |
| 5,699,027 | 12/1997 | Tsuji et al. | 333/193 |
| 5,719,536 | 2/1998 | Matsui et al. | 333/193 |

FOREIGN PATENT DOCUMENTS

| | | | |
|---|---|---|---|
| 4-150405 | 5/1992 | Japan | 333/193 |
| 6-69750 | 3/1994 | Japan | 333/193 |
| 6-152317 | 5/1994 | Japan | 333/193 |
| 7-264000 | 10/1995 | Japan | . |

*Primary Examiner*—Benny Lee
*Assistant Examiner*—Barbara Summons
*Attorney, Agent, or Firm*—Ratner & Prestia

[57] ABSTRACT

A resonator ladder type surface acoustic wave filter, has an input electrical terminal, an output electrical terminal, and a grounding terminal being formed on a piezoelectric substrate, a series arm surface acoustic wave resonator and a parallel arm surface acoustic wave resonator, each constructed from an interdigital transducer for exciting a surface acoustic wave, being formed between said input electrical terminal and said output electrical terminal, and when the center frequency of said resonator ladder type surface acoustic wave filter is denoted by fc, and capacitance determined by the number of electrode finger pairs and electrode finger overlap width in said interdigital transducer of said parallel arm surface acoustic wave resonator is denoted by Cp (fc: center frequency [GHz], Cp: capacitance of the interdigital transducer of the parallel arm surface acoustic wave resonator), capacitance C of multiples of said parallel arm surface acoustic wave resonator, connected to the same node between said input electrical terminal and said output electrical terminal, always satisfies the relation $$fc \cdot Cp < 4$$

10 Claims, 5 Drawing Sheets

FIG. 1

Cs: CAPACITANCE OF SERIES ARM SURFACE ACOUSTIC WAVE RESONATOR

Cp: CAPACITANCE OF PARALLEL ARM SURFACE ACOUSTIC WAVE RESONATOR

RESONATOR LADDER TYPE SURFACE ACOUSTIC WAVE FILTER

BACKGROUND OF THE INVENTION

1. Field of the Invention

The present invention relates to a surface acoustic wave filter that can selectively extract a desired frequency band by exciting a surface acoustic wave on a substrate made of a piezoelectric material, and more particularly to a resonator ladder type surface acoustic wave filter suited for use as a high-frequency filter in mobile communication apparatus of which sufficient attenuation of harmonic frequencies is required.

2. Related Art of the Invention

For many years, surface acoustic wave filters have been used widely as high-frequency filters in mobile communication applications. Among others, resonator ladder type surface acoustic wave filters have been receiving attention because of their low insertion loss, excellent 50 Ω matching, etc.

A prior art resonator ladder type surface acoustic wave filter will be described below. The basic principle of the resonator ladder type surface acoustic wave filter is the same as that of conventional ceramic ladder type filters, the only difference being that the resonators in the latter filters are replaced by surface acoustic wave resonators. In this type of filter, by making the resonant frequency of a series arm surface acoustic wave resonator substantially coincide with the antiresonant frequency of a parallel arm surface acoustic wave resonator, a filter characteristic is obtained that has a pass band between these frequencies and stop bands above the antiresonant frequency of the parallel arm surface acoustic wave resonator and below the resonant frequency of the series arm surface acoustic wave resonator.

Figure 6:
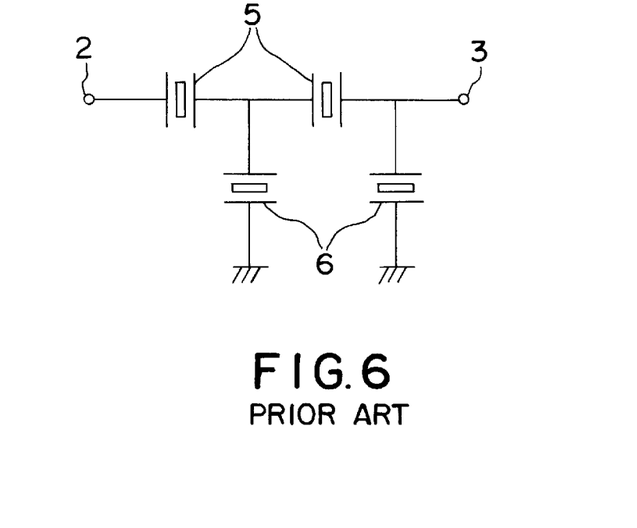
FIG. 6 is a diagram showing the arrangement of surface acoustic wave resonators in a prior art resonator ladder type surface acoustic wave filter.
Figure 7A:
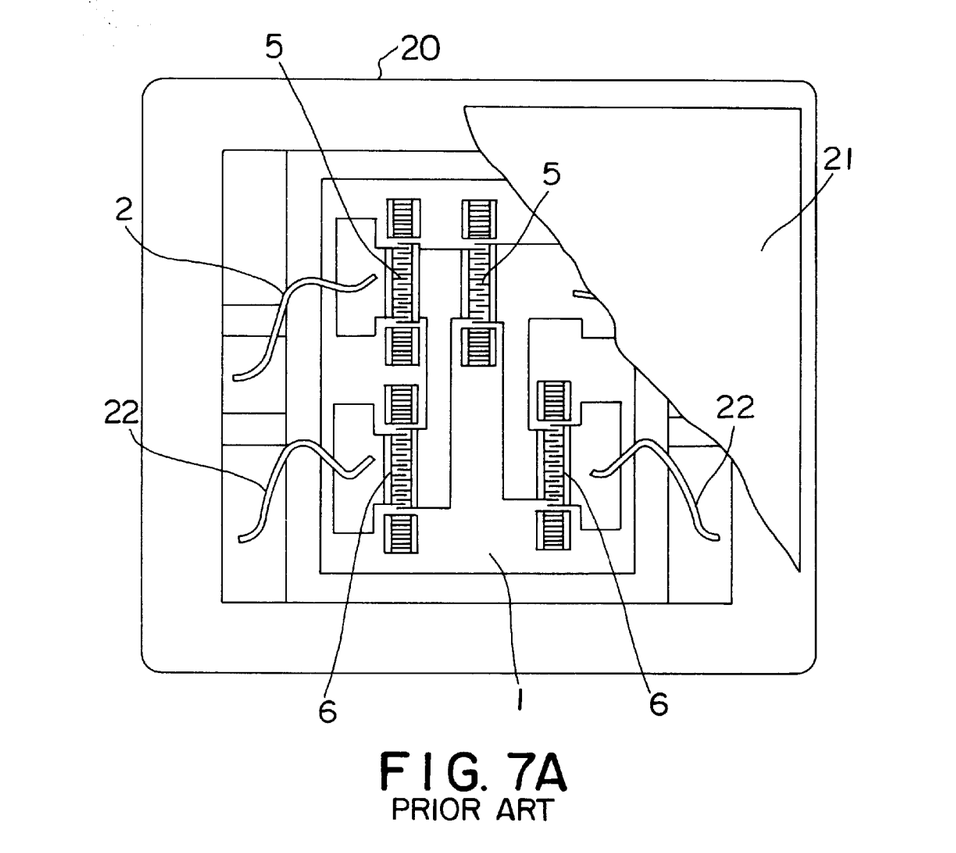
FIGS. 7A and 7B are diagrams respectively showing a top plan view in the upper part thereof and a cross sectional view in the lower part, illustrating a mounting method for the prior art resonator ladder type surface acoustic wave filter.
Figure 7B:
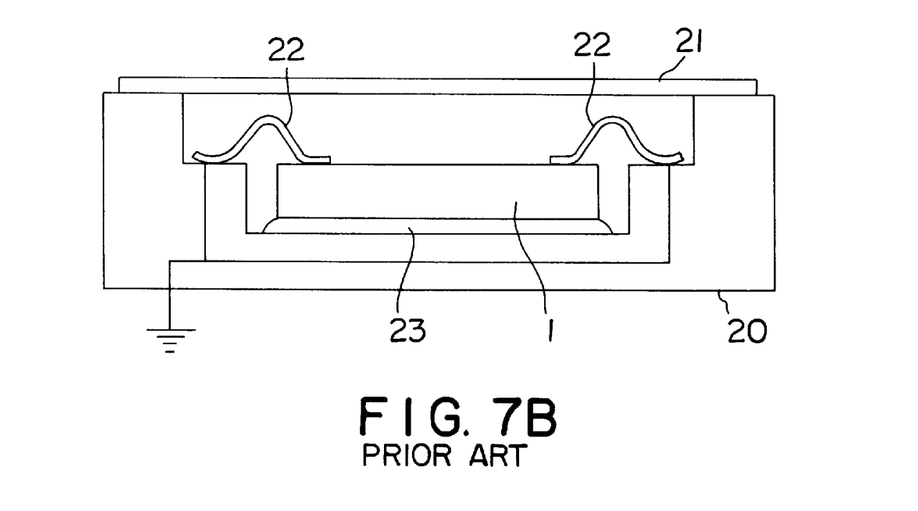

The basic configuration of the prior art resonator ladder type surface acoustic wave filter is shown in the circuit diagram of FIG. 6, in which series arm surface acoustic wave resonators and parallel arm surface acoustic wave resonators are alternately connected on a piezoelectric substrate; this piezoelectric substrate is housed in a package and electrically connected by bonding wires, as shown in FIGS. 7A and 7B. Here, reference numeral 1 designates the piezoelectric substrate, 2 an input electrical terminal, 3 an output electrical terminal, 5 the series arm surface acoustic wave resonators, and 6 the parallel arm surface acoustic wave resonators. Further, 20 is a casing, 21 is a cover, 22 is a grounding lead, and 23 is a plate.

Figure 8:
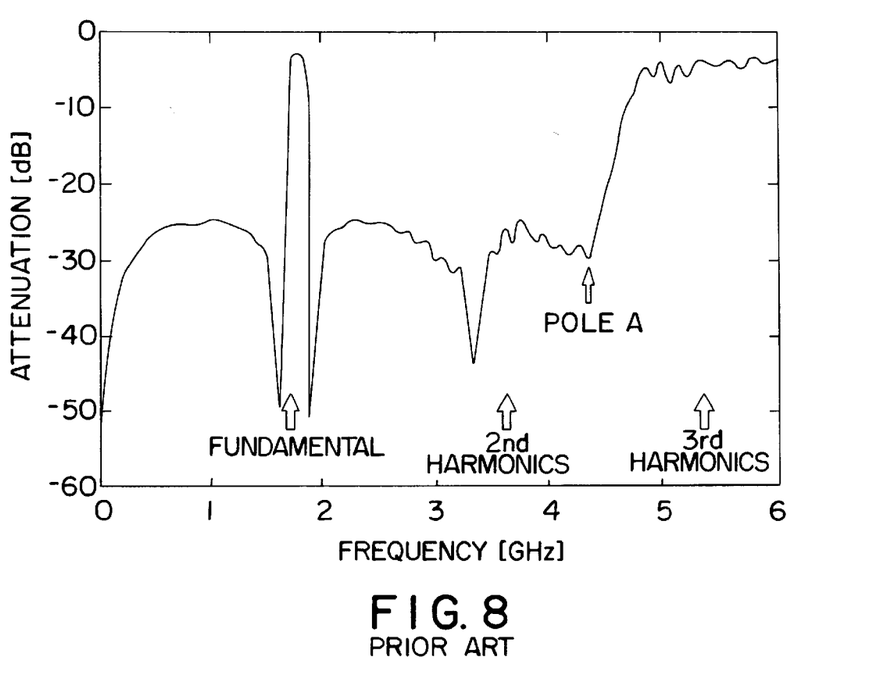
FIG. 8 is a diagram showing the frequency characteristic of the prior art resonator ladder type surface acoustic wave filter.

This resonator ladder type surface acoustic wave filter has a frequency characteristic such as shown in FIG. 8.

As can be seen from the frequency characteristic of FIG. 8, the prior art resonator ladder type surface acoustic wave filter achieves stable and good out-of-band rejection near the pass band, but in harmonic frequency regions such as the regions of the second and third harmonics, the out-of-band rejection rapidly decreases, thus degrading the filter characteristic. The reason for this is believed to be that the inductance associated with the strip lines connected to the parallel arm surface acoustic wave resonators 6 on the piezoelectric substrate 1, as well as the inductance associated with the strip lines and bonding wires within the package, causes a phenomenon similar to resonance in the harmonic frequency regions by interaction with the parallel arm surface acoustic wave resonators 6. To reduce this phenomenon, either the above inductances or the capacitances of the parallel arm surface acoustic wave resonators 6 must be reduced.

However, since the capacitances of the parallel arm surface acoustic wave resonators 6 are closely related to the out-of-band rejection characteristics near the pass band that are determined by electrical matching with filter external circuits and the capacitance ratio between the series arm surface acoustic wave resonators 5 and the parallel arm surface acoustic wave resonators 6, it is not possible to reduce the capacitances of the parallel arm surface acoustic wave resonators 6 arbitrarily.

SUMMARY OF THE INVENTION

The present invention has been devised in view of the above problem with the prior art, and it is an object of the invention to provide a resonator ladder type surface acoustic wave filter that provides high out-of-band rejection also in harmonic frequency regions such as the regions of the second and third harmonics, and that has stable and good frequency characteristics.

A resonator ladder type surface acoustic wave filter of a first aspect of the invention is characterized by that an input electrical terminal, an output electrical terminal, and a grounding terminal are formed on a piezoelectric substrate, a series arm surface acoustic wave resonator and a parallel arm surface acoustic wave resonator, each constructed from an interdigital transducer for exciting a surface acoustic wave, are formed between said input electrical terminal and said output electrical terminal, and when the center frequency of said resonator ladder type surface acoustic wave filter is denoted by fc, and capacitance determined by the number of electrode finger pairs and electrode finger overlap width in said interdigital transducer of said parallel arm surface acoustic wave resonator is denoted by Cp (fc: center frequency [GHz], Cp: capacitance of the interdigital transducer of the parallel arm surface acoustic wave resonator), capacitance Cp of multiples of said parallel arm surface acoustic wave resonator, connected to the same node between said input electrical terminal and said output electrical terminal, always satisfies the relation fc·Cp<4, and thereby stable and good frequency characteristics are obtained with the out-of-band rejection characteristics greatly improved in the harmonic frequency regions such as the second and third harmonic regions.

A resonator ladder type surface acoustic wave filter of a second aspect of the invention (according to said first invention) is characterized by that multiples of said grounding terminal formed on said piezoelectric substrate are not electrically connected to each other on said piezoelectric substrate, and thereby further stable frequency characteristics are obtained.

A resonator ladder type surface acoustic wave filter of a third aspect of the invention (according to said first or second invention) is characterized by that said piezoelectric substrate having said input electrical terminal, said output electrical terminal, and said grounding terminal is mounted in a package or on a mounting substrate having an input electrical terminal, an output electrical terminal, and a grounding terminal in such a manner that at least one of said terminals formed on said piezoelectric substrate faces its corresponding terminal formed in said package or on said mounting substrate, and said terminals facing each other are electrically interconnected via a conductive substance of a nonlinear shape.

This configuration permits a reduction in the inductance associated with electrical connections between the piezoelectric substrate and the package or the mounting substrate accommodating the piezoelectric substrate; as a result, stable and good frequency characteristics are obtained with the out-of-band rejection characteristics greatly improved in the harmonic frequency regions such as the second and third harmonic regions.

A resonator ladder type surface acoustic wave filter of a fourth aspect of the invention (according to said third invention) is characterized by that a conductive protrusion is preformed on at least one of said input terminal, said output terminal, and said grounding terminal formed on said piezoelectric substrate.

Since the distance between the piezoelectric substrate and the package or the mounting substrate can be maintained uniform, further stable frequency characteristics are obtained.

A resonator ladder type surface acoustic wave filter of a fifth aspect of the invention (according to said fourth invention), is characterized by that stud bump bonding (SBB) mounting is employed, and thereby further stable frequency characteristics are obtained.

A resonator ladder type surface acoustic wave filter of a sixth aspect of the invention (according to said third invention), is characterized by that said conductive substance is a conductive filler or a conductive sheet.

Since the distance between the piezoelectric substrate and the package or the mounting substrate can be maintained uniform, further stable frequency characteristics are obtained.

DESCRIPTION OF THE REFERENCE NUMERALS

1. PIEZOELECTRIC SUBSTRATE
2. INPUT ELECTRICAL TERMINAL
3. OUTPUT ELECTRICAL TERMINAL
4. GROUNDING TERMINAL
5. SERIES ARM SURFACE ACOUSTIC WAVE RESONATOR
6. PARALLEL ARM SURFACE ACOUSTIC WAVE RESONATOR
10. MOUNTING SUBSTRATE
11. GROUNDING TERMINAL ON MOUNTING SUBSTRATE
12. EXTERNAL GROUNDING TERMINAL ON MOUNTING SUBSTRATE
13. VIA HOLE
14. CONDUCTIVE PROTRUSION

Preferred Embodiments

The preferred embodiments of the present invention will be described below with reference to the accompanying drawings.

<Embodiment 1>

Figure 1:
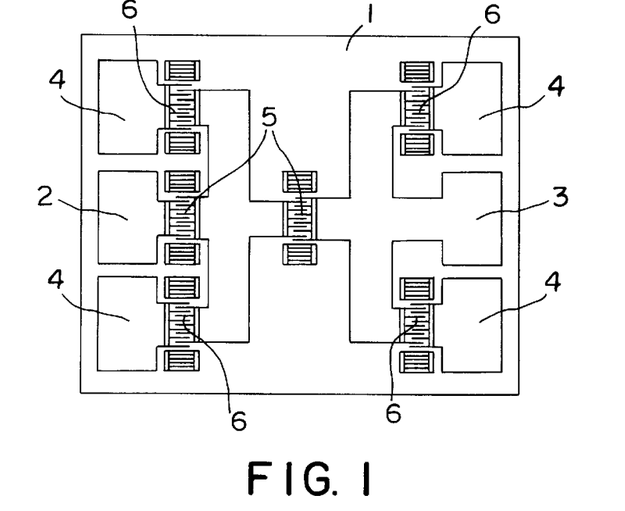
FIG. 1 is a diagram showing a resonator ladder type surface acoustic wave filter according to a first embodiment of the present invention.

FIG. 1 is a diagram showing a resonator ladder type surface acoustic wave filter according to a first embodiment of the present invention.

As shown in FIG. 1, on a piezoelectric substrate 1 are formed: an input electrical terminal 2; an output electrical terminal 3; series arm surface acoustic wave resonators 5 and parallel arm surface acoustic wave resonators 6 constructed from interdigital transducers (hereinafter called the IDTs) for exciting surface acoustic waves; and grounding terminals 4 connected to the parallel arm surface acoustic wave resonators 6. These constituent elements together constitute the resonator ladder type surface acoustic wave filter. In the configuration shown here, reflectors extending along the direction of surface acoustic wave propagation are provided on both sides of each of the series arm surface acoustic wave resonators 5 and parallel arm surface acoustic wave resonators 6, but in some configurations, such reflectors are not provided.

A resonator ladder type surface acoustic wave filter with a center frequency of 1.9 GHz and a pass band width of 75 MHz was fabricated in accordance with the present embodiment. The piezoelectric substrate 1 used was a 36° Y-cut, X-direction propagation lithium tantalate substrate. On this piezoelectric substrate 1, the series arm surface acoustic wave resonators 5 and the parallel arm surface acoustic wave resonators 6 were connected as shown in the lower part of FIG. 2.

Figure 2:
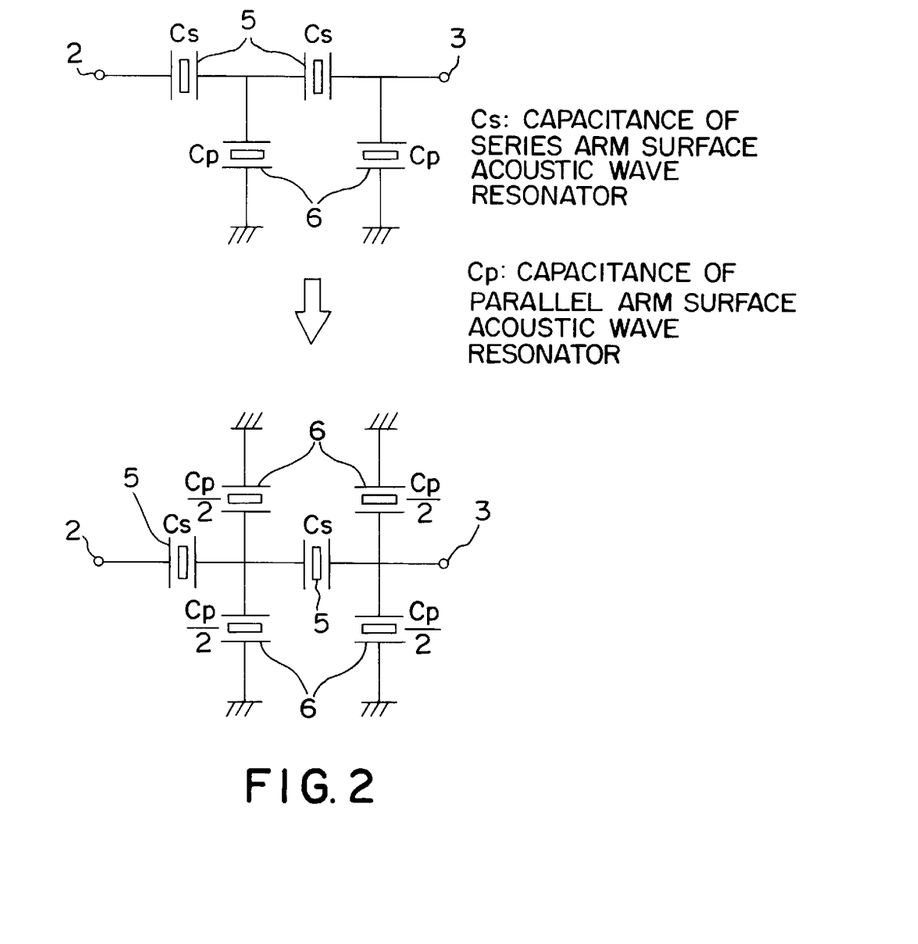
FIG. 2 is a diagram showing in the lower part thereof the arrangement of surface acoustic wave resonators in the resonator ladder type surface acoustic wave filter according to the first embodiment of the present invention and, in the upper part thereof, the configuration of the prior art.

In this configuration, the parallel arm surface acoustic wave resonators 6 are arranged so that the capacitance Cp of each parallel arm surface acoustic wave resonator 6 in the prior art configuration shown in the upper part of FIG. 2 is split between two parts, each with a capacitance of Cp/2, and so that the two parallel arm surface acoustic wave resonators 6, each with the capacitance Cp/2, are connected in parallel to the node to which, in the prior art configuration, each parallel arm surface acoustic wave resonator 6 with the capacitance Cp was connected.

Therefore, the combined capacitance of the parallel arm surface acoustic wave resonators 6 in the present embodiment remains the same as that in the prior art configuration, so that the above arrangement does not affect the electrical matching with external circuits. Further, the capacitance ratio (the ratio of the parallel arm surface acoustic wave resonator capacitance Cp to the series arm surface acoustic wave resonator capacitance Cs) also remains unchanged, leaving the out-of-band rejection characteristics near the pass band unaffected.

Conditions for the split arrangement of the parallel arm surface acoustic wave resonators 6 will be shown below. In the frequency characteristic of the prior art configuration, the out-of-band rejection begins to drop rapidly at pole A, as shown in FIG. 8, the filter attenuation in the third harmonic region being nearly the same as that in the pass band. This pole A can be moved along the frequency axis by varying the capacitance of each parallel arm surface acoustic wave resonator 6, that is, the pole A moves toward the higher frequency side as the capacitance is reduced.

Figure 9:
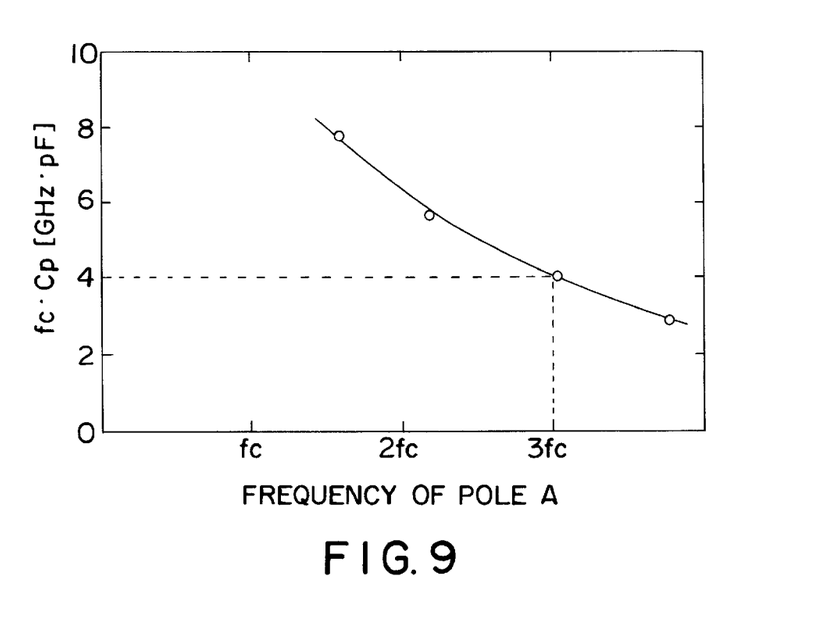
FIG. 9 is a diagram showing the relationship between the capacitance Cp of a parallel arm surface acoustic wave resonator and the frequency of pole A.

FIG. 9 is a diagram showing the relationship between the capacitance Cp of the parallel arm surface acoustic wave resonator 6 and the frequency of the pole A. The vertical axis plots the product of the capacitance Cp and the center frequency fc of the resonator ladder type surface acoustic wave filter, and the horizontal axis the frequency of the pole A represented in terms of fc. From FIG. 9, it can be seen that fc·Cp must be made smaller than 4 if the pole A is to be moved beyond the third harmonic region. However, considering the out-of-band rejection near the pass band and the matching with external circuits in filter design, it is not always possible to make fc·Cp smaller than 4. Accordingly, when fc·Cp is larger than 4, the capacitance Cp of the parallel arm surface acoustic wave resonator 6 is reduced by splitting the capacitance, to move the pole A into the frequency region higher than the third harmonic region.

In the resonator ladder type surface acoustic wave filter fabricated in the present embodiment, the surface acoustic wave excitation interdigital transducer (hereinafter called the IDT) of each series arm surface acoustic wave resonator contains electrode fingers, each with a width of 0.517 $\mu$m, arranged periodically at a center-to-center spacing of 2.068 $\mu$m; the number of opposing electrode finger pairs in the IDT is 100.5, the overlap width of the opposing electrode fingers is 30 $\mu$m, and 100 reflectors are provided on each side of the IDT. Likewise, the IDT of each parallel arm surface acoustic wave resonator contains electrode fingers, each with a width of 0.544 $\mu$m, arranged periodically at a center-to-center spacing of 2.176 $\mu$m; the number of opposing electrode finger pairs in the IDT is 50.5, the overlap width of the opposing electrode fingers is 50 $\mu$m, and 100 reflectors are provided on each side of the IDT. Here, since, in the prior art example, the capacitance Cp of each parallel arm surface acoustic wave resonator is 2.4 [pF] and hence fc·Cp=4.56, the number of electrode finger pairs in each parallel arm surface acoustic wave resonator in the present embodiment is reduced by half compared with the prior art example so that the capacitance is reduced by half to 1.2 [pF].

These surface acoustic wave resonators were fabricated on the piezoelectric substrate, as shown in FIG. 1. Then, the piezoelectric substrate was mounted in a package and electrical connections between the substrate and the package were made using bonding wires.

Figure 3:
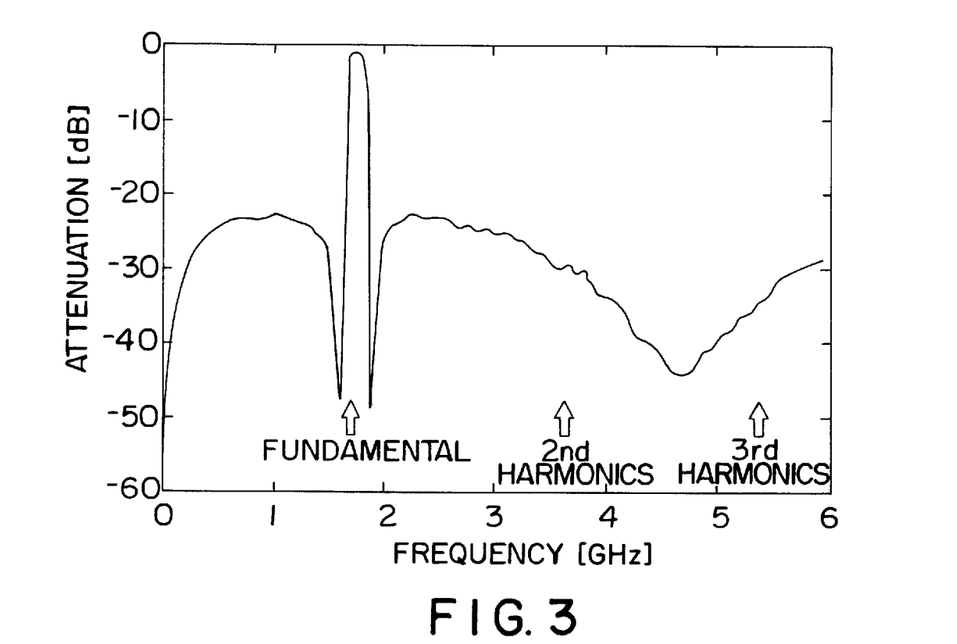
FIG. 3 is a diagram showing the frequency characteristic of the resonator ladder type surface acoustic wave filter according to the first embodiment of the present invention.

The frequency characteristic of the thus fabricated resonator ladder type surface acoustic wave filter is shown in FIG. 3. As compared with the prior art resonator ladder type surface acoustic wave filter, the out-of-band rejection characteristics in the harmonics regions are greatly improved, achieving, in particular, an improvement of 25 dB or greater in the third harmonic region.

In the present embodiment, the capacitance of the parallel arm surface acoustic wave resonator was divided into two equal portions, but it is apparent that the effect of the present invention is not impaired if the capacitance is not specifically divided into two equal portions. It will also be appreciated that a similar effect can be obtained if the capacitance is divided into three equal portions. The reason is that the parallel arm surface acoustic wave resonator of this embodiment has a smaller capacitance than that in the parallel arm surface acoustic wave resonator of the prior art.

In other words, the resonator ladder type surface acoustic wave filter is fabricated so that the capacitance Cp of each one of the parallel arm surface acoustic wave resonators connected in parallel to the same node between the input electrical terminal 2 and the output electrical terminal 3 satisfies the relation $$fc \cdot Cp < 4$$

Further, when the plurality of grounding terminals formed on the piezoelectric substrate are not electrically connected to each other, the area of each grounding terminal on the piezoelectric substrate is, in effect, reduced, and stray and parasitic capacitances can thus be suppressed. As a result, stable out-of-band rejection can be obtained over the harmonic frequency regions.

As described above, according to the resonator ladder type surface acoustic wave filter of the present embodiment, stable and good frequency characteristics are obtained with the out-of-band rejection characteristics greatly improved in the harmonic frequency regions such as the second and third harmonic regions, as compared with the prior art resonator ladder type surface acoustic wave filter.

<Embodiment 2>

The embodiment hereinafter described is concerned with a method for reducing the inductance associated with the strip lines connected to the parallel arm surface acoustic wave resonators on the piezoelectric substrate and the strip lines and bonding wires within the package, as described in connection with the problem that the invention is aimed at solving.

To reduce the inductance, several methods are possible, such as increasing the width and reducing the length of the strip lines or increasing the number of bonding wires. However, of the above strip lines, the inductance associated with the bonding wires electrically connecting the piezoelectric substrate to the package is the most unstable and the inductance value is as large as about 1 nH. This means that the out-of-band rejection in the harmonic frequency regions can be increased by reducing the inductance associated with the electrical connections between the piezoelectric substrate and the package.

Figure 4:
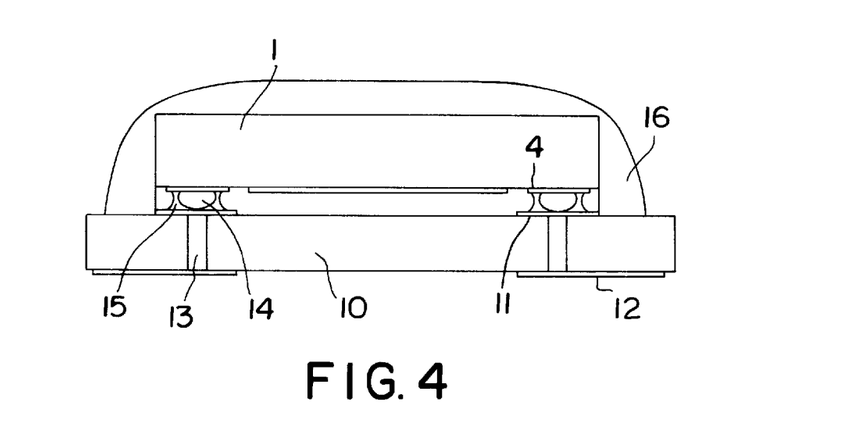
FIG. 4 is a cross sectional view showing the structure, including a grounding terminal, of a resonator ladder type surface acoustic wave filter according to a second embodiment of the present invention.

FIG. 4 is a diagram showing a resonator ladder type surface acoustic wave filter according to a second embodiment of the present invention. A cross sectional view including the grounding terminals on the piezoelectric substrate is shown here.

As shown in FIG. 4, the piezoelectric substrate 1 is mounted with its IDT side facing a mounting substrate 10, and conductive protrusions 14 formed on the grounding terminals on the piezoelectric substrate 1 are electrically connected to grounding terminals 11 on the mounting substrate 10. Each of the conductive protrusions 14 is surrounded by a conductive material 15 in order to provide reinforcement.

Each grounding terminal 11 on the mounting substrate 10 is electrically connected to an external grounding terminal 12 through a via hole 13. The electrical connection between the grounding terminal 11 and external grounding terminal 12 on the mounting substrate 10 may be made through a strip line folded back across the periphery of the mounting substrate 10, rather than through the via hole 13. Further, a resin 16 or the like may be applied in such a manner as to encircle the periphery of the piezoelectric substrate 1 and mounting substrate 10 for sealing.

In this embodiment, since the spacing between the piezoelectric substrate and the mounting substrate can be maintained uniform by means of the conductive protrusions, the value of inductance associated with the electrical connections between them can be held at a stable level. Further, by reinforcing the periphery of each protrusion with the conductive material, the cross sectional area of the connection is increased, contributing to reducing the inductance value. The SBB (stud bump bonding) mounting method is best suited for such a configuration.

Also, the same effect can be obtained if a conductive filler or conductive sheet is used instead of the conductive protrusion in order to keep uniform the spacing between the piezoelectric substrate and the mounting substrate.

Figure 5:
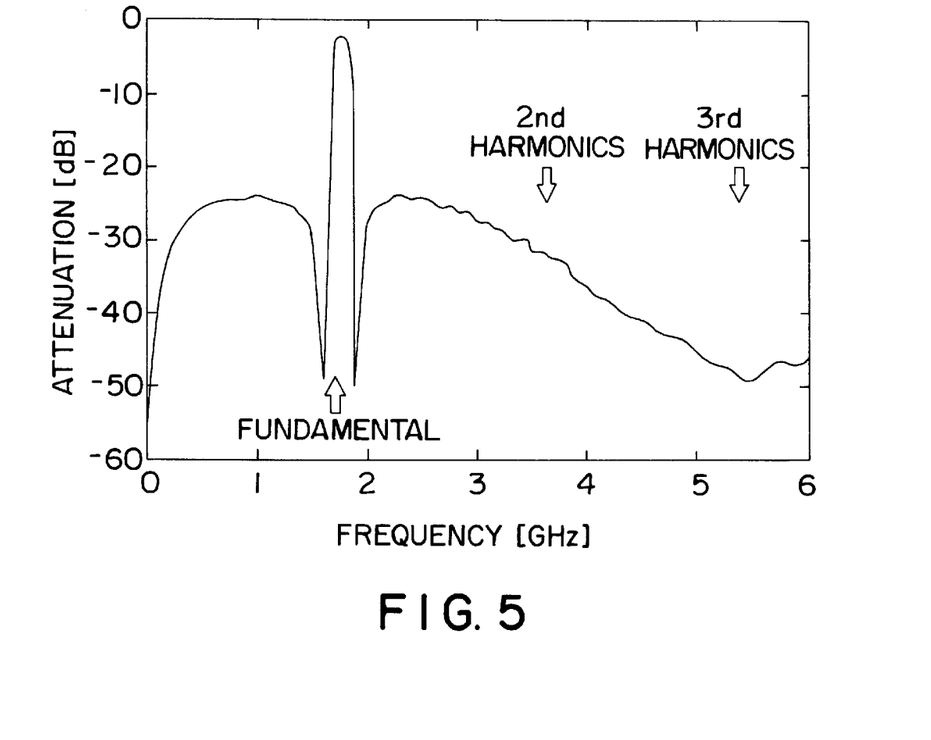
FIG. 5 is a diagram showing the frequency characteristic of the resonator ladder type surface acoustic wave filter according to the second embodiment of the present invention.

The frequency characteristic of the thus mounted resonator ladder type surface acoustic wave filter is shown in FIG. 5. The out-of-band rejection characteristics are greatly improved not only over the resonator ladder type surface acoustic wave filter of the prior art but also over the first embodiment; in particular, in the third harmonic region, an improvement of 30 dB or more has been obtained over the prior art resonator ladder type surface acoustic wave filter. It should be noted that the frequency characteristic shown in FIG. 5 is that of the surface acoustic wave filter in which the feature of the first embodiment is also incorporated. Accordingly, the characteristic shown here is improved over the characteristic of FIG. 3.

As described above, according to the resonator ladder type surface acoustic wave filter of the present embodiment, stable and good frequency characteristics are obtained with the out-of-band rejection characteristics greatly improved in the harmonic frequency regions such as the second and third harmonic regions, as compared with the prior art resonator ladder type surface acoustic wave filter.

As described above, according to the resonator ladder type surface acoustic wave filter of the present invention, stable and good frequency characteristics are achieved with the out-of-band rejection characteristics greatly improved in the harmonic regions such as the second and third harmonic regions.

What is claimed is:

1. A resonator ladder type surface acoustic wave filter for bandpassing a fundamental frequency and suppressing harmonic frequencies, comprising:

an input electrical terminal, an output terminal, and a grounding terminal formed on a piezoelectric substrate;

at least two series arm surface acoustic wave resonators connected in series at a node between said input electrical terminal and said output electrical terminal and a plurality of parallel arm surface acoustic wave resonators connected in parallel at said node, each constructed from an interdigital transducer for exciting a surface acoustic wave, wherein when a center frequency of said resonator ladder type surface acoustic wave filter is denoted by fc, and a capacitance determined by a number of electrode finger pairs and electrode finger overlap width in said interdigital transducer of one of said plurality of parallel arm surface acoustic wave resonators is denoted by Cp, then each parallel arm surface acoustic wave resonator has the capacitance Cp limited to a value satisfying an inequality of fc·Cp>4, wherein fc is in GHz and Cp is in pF;

a mounting substrate for mounting the piezoelectric substrate, the mounting substrate including further input, output and grounding terminals, and at least one of said further terminals facing a corresponding terminal of the piezoelectric substrate; and said facing terminals electrically connected by a conductive substance having a nonlinear shape;

wherein the surface acoustic wave filter is effective in bandpassing the fundamental frequency and suppressing the second and third harmonic frequencies.

2. A resonator ladder type-surface acoustic wave filter according to claim 1, wherein multiples of said grounding terminal formed on said piezoelectric substrate are not electrically connected to each other on said piezoelectric substrate.

3. A resonator ladder type surface acoustic filter according to claim 1, wherein said conductive substance is a conductive filler or a conductive sheet.

4. A resonator ladder type surface acoustic wave filter according to claim 1, wherein a conductive protrusion is performed on at least one of said input terminal, said output terminal, and said grounding terminal formed on said piezoelectric substrate.

5. A resonator ladder type surface acoustic wave filter according to claim 4, wherein stud bump bonding (SBB) is employed.

6. A resonator ladder type surface acoustic wave filter having a center frequency, fc, in units of GHz, comprising an input electrical terminal, an output electrical terminal, and a grounding terminal formed on a piezoelectric substrate, a series arm surface acoustic wave resonator and a parallel arm surface acoustic wave resonator means, each formed of an interdigital transducer for exciting a surface acoustic wave and each coupled at a node between said input electrical terminal and said output electrical terminal, and said parallel arm surface acoustic wave resonator means is comprised of (a) a single parallel arm surface acoustic wave resonator having a first capacitive value of Cp, in units of pF, when fc·Cp<4, and (b) a plurality of parallel arm surface acoustic wave resonators connected in parallel at said node, each having the first capacitive value of Cp reduced by 1/n to a second capacitive value of Cp/n, wherein fc·Cp/n<4 and n is a number of the plurality of parallel arm surface acoustic wave resonators, when fc·Cp>4.

7. A resonator type surface acoustic wave filter according to claim 6, wherein said capacitive value Cp is determined by the number of electrode finger pairs and electrode finger overlap width of said interdigital transducers of said plurality of parallel arm surface acoustic wave resonators.

8. A method of making a resonator ladder type surface acoustic wave (SAW) filter on a piezoelectric substrate having a series arm SAW resonator and a first parallel arm SAW resonator, the method comprising the steps of:

(a) determining a center frequency, fc, of the resonator ladder type SAW filter, wherein fc is in GHz;

(b) determining a capacitance, Cp, of the first parallel arm SAW resonator, wherein Cp is in pF; and (c) replacing the first parallel arm SAW resonator with a plurality of second parallel arm SAW resonators connected to a node, with fc·Cp being greater than 4, wherein each of the plurality of second parallel arm SAW resonators has a limited capacitance of Cp/n and then $$\left(\frac{Cp}{n} \cdot fc\right)$$

becomes less than 4 and n is a number of the plurality of second parallel arm SAW resonators.

9. The method of claim 8 including the steps of forming an input electrical terminal, an output electrical terminal and a grounding terminal on the piezoelectric substrate; and the step of replacing the first parallel arm SAW resonator with the plurality of second parallel arm SAW resonators connected to a node includes forming the node between the input electrical terminal and the output electrical terminal.

10. The method of claim 8 wherein (a) the series arm SAW resonator and the first and second parallel arm SAW resonators are constructed from interdigital transducers, and (b) the capacitance, Cp, is determined by a number of electrode finger pairs and electrode finger overlap width in the interdigital transducer of the first and second parallel arm SAW resonators.

* * * * *